US010295608B2

(12) United States Patent
Rocci et al.

(10) Patent No.: US 10,295,608 B2
(45) Date of Patent: May 21, 2019

(54) NON-INTRUSIVE CORRELATING BATTERY MONITORING SYSTEM AND METHOD

(71) Applicant: Phoenix Broadband Technologies, LLC, Hatfield, PA (US)

(72) Inventors: Joseph D Rocci, Lansdale, PA (US); Michael Louis Quelly, Quakertown, PA (US); Walter Michael Wilczewski, Glenside, PA (US)

(73) Assignee: Phoenix Broadband Technologies, LLC, Hatfield, PA (US)

( * ) Notice: Subject to any disclaimer, the term of this patent is extended or adjusted under 35 U.S.C. 154(b) by 263 days.

(21) Appl. No.: 14/797,335

(22) Filed: Jul. 13, 2015

(65) Prior Publication Data

US 2016/0018473 A1 Jan. 21, 2016

Related U.S. Application Data

(60) Provisional application No. 62/026,318, filed on Jul. 18, 2014.

(51) Int. Cl.
| | |
|---|---|
| *G01R 31/392* | (2019.01) |
| *G01R 31/396* | (2019.01) |
| *H01M 10/48* | (2006.01) |
| *H02J 7/00* | (2006.01) |
| *G01R 31/382* | (2019.01) |
| *G01R 31/36* | (2019.01) |
| *H01M 10/12* | (2006.01) |

(52) U.S. Cl.
CPC ......... *G01R 31/392* (2019.01); *G01R 31/396* (2019.01); *H01M 10/48* (2013.01); *H01M 10/482* (2013.01); *H01M 10/486* (2013.01); *H02J 7/0047* (2013.01); *G01R 31/3646* (2019.01); *G01R 31/382* (2019.01); *H01M 10/121* (2013.01)

(58) Field of Classification Search
CPC .......................... G01R 31/3679; G01R 31/392
USPC ......................................................... 324/431
See application file for complete search history.

(56) References Cited

U.S. PATENT DOCUMENTS

| | | | |
|---|---|---|---|
| 4,336,314 A | 6/1982 | Yonezu | |
| 4,885,523 A | 12/1989 | Koenck | |
| 4,965,738 A | 10/1990 | Bauer et al. | |

(Continued)

FOREIGN PATENT DOCUMENTS

| | | |
|---|---|---|
| DE | 10 2008 016957 | 10/2009 |
| JP | 63-124732 | 5/1988 |

(Continued)

OTHER PUBLICATIONS

IEEE Recommended Practice for Maintenance, Testing, and Replacement of Valve-Regulated Lead-Acid (VRLA) Batteries for Stationary Applications, IEEE Power and Energy Society, IEEE Std 1188-2005, Feb. 8, 2006.

(Continued)

*Primary Examiner* — Jerry D Robbins
(74) *Attorney, Agent, or Firm* — BakerHostetler (57) ABSTRACT

There is disclosed a system and method for determining whether a battery or battery system has encountered a thermal failure and/or end of service life condition. The battery monitoring system is configured to generate a plurality of alarms based on the occurrence of a number of conditions in the battery system.

22 Claims, 6 Drawing Sheets

(56) References Cited

U.S. PATENT DOCUMENTS

| | | |
|---|---|---|
| 5,119,011 A | 6/1992 | Lambert |
| 5,504,415 A | 4/1996 | Podrazhansky |
| 5,606,242 A | 2/1997 | Hull et al. |
| 5,666,040 A | 9/1997 | Bourbeau |
| 5,862,515 A | 1/1999 | Kobayashi et al. |
| 5,869,949 A | 2/1999 | Nishikawa et al. |
| 5,936,385 A | 8/1999 | Patillon et al. |
| 6,005,367 A | 12/1999 | Rohde |
| 6,081,095 A | 6/2000 | Tamura et al. |
| 6,137,267 A | 10/2000 | Kates et al. |
| 6,198,253 B1 * | 3/2001 | Kurle ............... A61N 1/3975 320/132 |
| 6,239,579 B1 | 5/2001 | Dunn |
| 6,268,710 B1 | 7/2001 | Koga |
| 6,271,643 B1 | 8/2001 | Becker et al. |
| 6,307,349 B1 | 10/2001 | Koenck et al. |
| 6,404,166 B1 * | 6/2002 | Puchianu ............ B60L 3/0046 320/116 |
| 6,476,583 B2 | 11/2002 | McAndrews |
| 6,504,344 B1 | 1/2003 | Adams et al. |
| 6,532,425 B1 * | 3/2003 | Boost ................ G01R 31/3624 320/134 |
| 6,583,603 B1 | 6/2003 | Baldwin |
| 6,611,774 B1 * | 8/2003 | Zaccaria ........... G01R 31/3648 320/116 |
| 6,936,995 B2 | 8/2005 | Kapsokavathis et al. |
| 6,983,212 B2 | 1/2006 | Burns |
| 7,166,384 B2 | 1/2007 | LaFollette et al. |
| 7,173,397 B2 | 2/2007 | Kinoshita et al. |
| 7,256,695 B2 | 8/2007 | Hamel et al. |
| 7,474,228 B2 | 1/2009 | Lockhart et al. |
| 7,557,539 B2 | 7/2009 | Takagi et al. |
| 7,710,119 B2 | 5/2010 | Bertness |
| 7,728,552 B2 | 6/2010 | Burns |
| 7,970,560 B2 | 6/2011 | Rocci et al. |
| 8,032,316 B2 | 10/2011 | Rocci et al. |
| 8,044,815 B2 | 10/2011 | Du et al. |
| 8,054,034 B2 | 11/2011 | Lim |
| 8,204,702 B2 | 6/2012 | Center |
| 8,311,753 B2 | 11/2012 | Rocci et al. |
| 8,350,529 B2 | 1/2013 | Loncarevic |
| 8,428,894 B2 | 4/2013 | Rocci et al. |
| 8,504,314 B2 | 8/2013 | Rocci et al. |
| 8,558,712 B2 * | 10/2013 | Fechalos ............ H01M 10/482 320/116 |
| 8,829,857 B2 | 9/2014 | Minamiura |
| 8,952,823 B2 | 2/2015 | Xie et al. |
| 9,587,942 B2 * | 3/2017 | Schierbeek ............ G01C 17/38 |
| 2003/0076250 A1 | 4/2003 | Enochson et al. |
| 2003/0094928 A1 | 5/2003 | Emori et al. |
| 2005/0038614 A1 | 2/2005 | Botts et al. |
| 2005/0156559 A1 | 7/2005 | Thibedeau |
| 2005/0252546 A1 | 11/2005 | Sasaki |
| 2006/0017444 A1 | 1/2006 | Fechalos et al. |
| 2006/0152190 A1 | 7/2006 | Riemschneider |
| 2008/0143292 A1 | 6/2008 | Ward |
| 2008/0197808 A1 | 8/2008 | Banta et al. |
| 2008/0252257 A1 | 10/2008 | Sufrin-Disler |
| 2008/0258683 A1 | 10/2008 | Chang |
| 2008/0280192 A1 * | 11/2008 | Drozdz ................. B60K 6/28 429/62 |
| 2010/0281183 A1 | 11/2010 | Van Bebber |
| 2011/0068746 A1 | 3/2011 | Rocci et al. |
| 2011/0199053 A1 * | 8/2011 | Minamiura ......... H01M 10/441 320/136 |
| 2011/0288798 A1 | 11/2011 | Rocci et al. |
| 2012/0022817 A1 | 1/2012 | Rocci et al. |
| 2013/0135110 A1 * | 5/2013 | Xie ..................... G08B 29/181 340/636.11 |
| 2014/0195179 A1 | 7/2014 | Guerin |
| 2015/0028816 A1 | 1/2015 | Lee |

FOREIGN PATENT DOCUMENTS

| | | |
|---|---|---|
| JP | 2005-328642 | 11/2005 |
| JP | 2009-303308 | 12/2009 |
| JP | 2010-195065 | 9/2010 |
| WO | WO 2007/044872 A1 | 4/2007 |

OTHER PUBLICATIONS

IEEE Recommended Practice for Maintenance, Testing, and Replacement of Valve-Regulated Lead-Acid (VRLA) Batteries for Stationary Applications, IEEE Power and Energy Society, 1188a 2014 (Approved May 16, 2014).

* cited by examiner

NON-INTRUSIVE CORRELATING BATTERY MONITORING SYSTEM AND METHOD

CROSS-REFERENCE TO RELATED APPLICATIONS

This application claims the benefit of U.S. Provisional Patent Application No. 62/026,318, filed Jul. 18, 2014, the entirety of which is incorporated herein by reference.

FIELD

The present invention pertains generally to battery monitoring systems and methods. More particularly, the invention pertains to a system and method for determining whether a battery or battery system has encountered a thermal failure and/or end of service life condition.

BACKGROUND

Thermal runaway is a catastrophic failure mode for Valve Regulated Lead-Acid (VRLA) batteries. A VRLA battery's internal temperature can rise significantly due to excessive charge current or sometimes just due to aging and normal charging current. Under these conditions, a regenerative heating condition can occur. As the battery temperature rises, an exothermic chemical reaction inside the battery causes heat to be generated. This heating causes the exothermic reaction to become more vigorous, and consequently, the battery becomes even hotter. This cycle, called thermal runaway, will continue until all current flow ceases. However, thermal runaway may lead to disastrous consequences. For example, the battery may bulge, split, and/or leak acid into the environment around it. Even under normal conditions, as the battery ages, it begins to draw more current from the charger, causing internal heating that can eventually lead to thermal runaway.

Systems that measure and/or monitor battery parameters such as voltage, current, impedance, and temperature are known. Some of these systems attempt to predict future battery performance by applying correlation rules to trends in the measured parameters. However, known systems are cumbersome, expensive, inaccurate, unreliable, and/or not easily installed. Most notably, known systems are believed to require a battery intrusion, such as an electrical connection to the monitored battery and/or battery system. It is therefore desirable to provide a system and method that overcomes these shortcomings.

SUMMARY

Thermal events are detected by non-intrusively monitoring a battery's temperature rise relative to ambient temperature. By correlating a rise in temperature of the battery (relative to ambient temperature) to changes in the battery's normal, or "float," charging current, conclusions can be drawn about whether the battery is operating normally, is in a potential overheated state from excessive charge current, is spiraling out of control into an impending thermal runaway condition, or is just aging naturally but approaching the end of its service life. Each of these conditions can be automatically detected, and service personnel can be alerted in advance so that pre-emptive or remedial action can be implemented.

There is provided a system and method whereby correlation rules are applied to measured parameters in a battery monitoring system to predict thermal failures and end of service life of one or more batteries in the system. The battery monitoring system comprises a site control unit, measurement interface units such as remote input modules and current monitoring interfaces, as well as current and temperature measurement probes which respectively measure current and temperature of the one or more batteries in a non-intrusive manner. A number of alarms can be generated based on these measurements. The alarms may comprise explicit alarms, triggered by absolute measurements, and/or implicit alarms which are indicative of, for example, temperature rise caused by excessive current, a thermal runaway condition, or natural aging of the battery.

DETAILED DESCRIPTION OF ILLUSTRATIVE EMBODIMENTS

Figure 1:
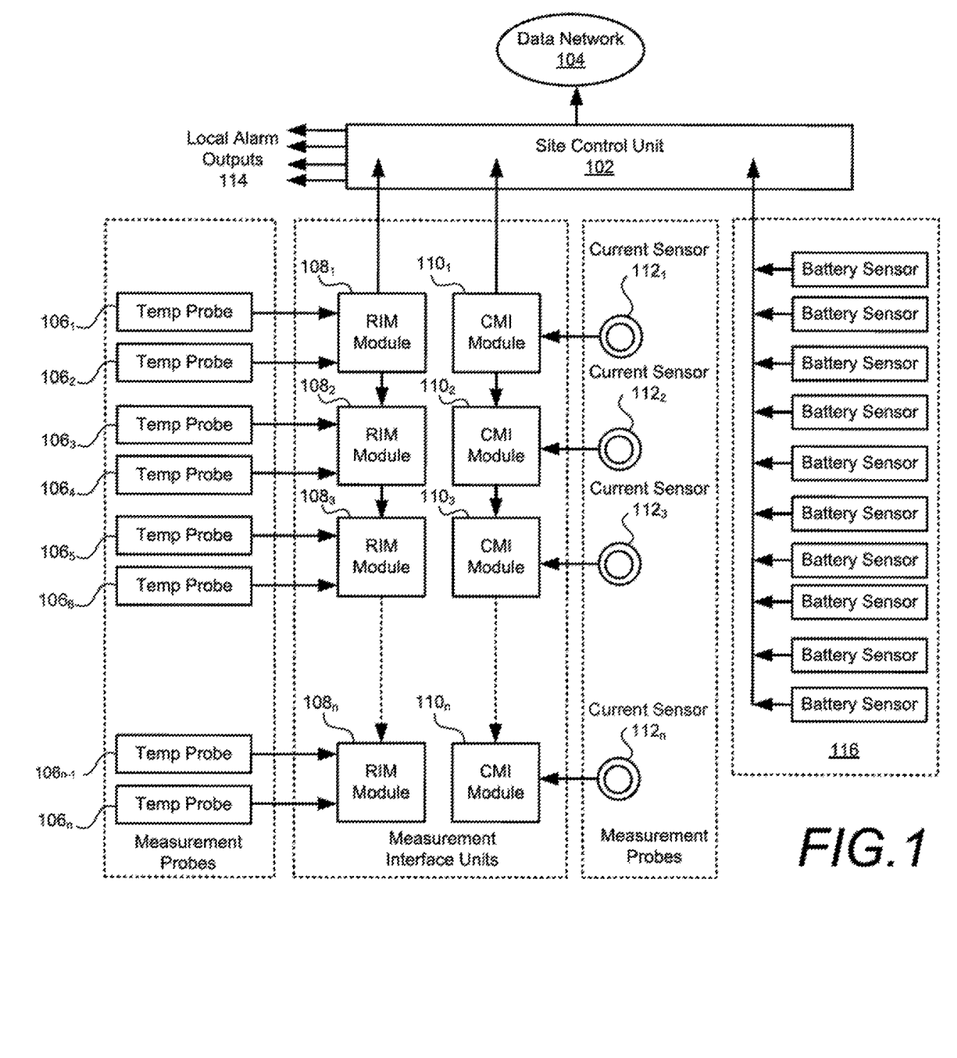
FIG. 1 is a block diagram of a non-intrusive battery monitoring system according to an embodiment of the invention.

Turning now to the drawings, wherein like numerals represent like elements, there is shown in FIG. 1 a non-intrusive battery monitoring system according to an embodiment of the invention. The system of FIG. 1 comprises three main classes of components: a site control unit 102; measurement interface units comprising remote input modules (RIMs) 108$_1$ . . . 108$_N$ and current monitoring interface modules (CM's) 110$_1$ . . . 110$_N$; and, measurement probes comprising temperature probes 106$_1$ . . . 106$_N$ and current sensors 112$_1$ . . . 112$_N$. Optionally, battery sensors 116 and remote output modules (ROMs) (not shown) may be provided, as discussed below.

Site control unit (SCU) 102 preferably comprises a specially programmed micro-computer, interfaced to a data network 104 (such as a local area network or the Internet), as well as contact closure outputs 114 for connection to local alarm monitoring systems. A web server, I/O points for connection of measurement probes, and a logging memory system (not shown) may also be provided. Reference is made to U.S. Pat. Nos. 7,970,560 and 8,032,316, and U.S. Published Patent Application No. 2011/0068746A1, the entireties of which are incorporated herein by reference, for further details of an exemplary implementation of a site control unit 102 and related components and functionalities.

The measurement interface units 108 and 110 are preferably located near the points at which the temperature and current measurements are to be made by the temperature probes 106 and current sensors 112. Multiple interface units 108, 110 can be operated on a powered bus using a hardware standard such as RS-485. Special-purpose probes 106, 112 may be built into the interface units or physically and/or electrically attached to the measurement interface units 108, 110 externally.

RIMs 108 can connect to temperature probes 106, as well as to other analog measurement devices (not shown) such as digital signaling devices, contact closures, etc. A RIM 108 may accept a plurality, e.g., six, precision digital temperature probes. CM's 110 can work in conjunction with external toroidal DC current probes, such as current sensors 112, to make highly accurate measurements of very low DC currents. An exemplary current sensor used in a preferred practice of the invention is the model no. PBT-PA-CCS-1, manufactured by Phoenix Broadband Technologies, LLC, Hatfield, Pa. In an embodiment of the invention, each CM 110 accepts one DC current measurement probe.

As described in the aforementioned U.S. Pat. Nos. 7,970, 560 and 8,032,316, and U.S. Published Patent Application No. 2011/0068746A1, battery sensors 116 may be connected electrically to a battery's terminal posts, allowing it to measure, for example, the battery's voltage, post temperature, and internal resistance or impedance. Battery sensors 116 may additionally be connected directly to the SCU 102, whereby SCU 102 employs the data from battery sensors 116 to calculate information indicative of a battery health condition. The battery sensors 116 may also apply an equalizing charge to equalize the voltage of the battery. There can be many battery sensors 116 connected to a single SCU 102. However, battery sensors 116 are not required to implement the present invention. ROM's may also be provided to allow external equipment to be remotely controlled via relay contact closures built into the unit, but are not required to implement the present invention.

In an exemplary embodiment of the invention, temperature probes 106 and current sensors 112 connect to interface units 108 and 110, respectively, in order to make specialized measurements. Interface units 108 and 110 are further connected to respective interface points on the SCU 102. In this exemplary embodiment, each SCU 102 has interface points for up to eight RIM's 108, eight ROM's, and six CM's 110, allowing for up to forty-eight temperature measurement points and six precision DC current measurements.

Current sensors 112 can measure the current of one or more battery strings by methods of direct connection to the current carrying path, such as measurement of the voltage developed across a "shunt" resistor, by measuring the magnetic field around a current-carrying conductor using means such as Hall Effect sensors or flux-gate sensors, or by any other intrusive or non-intrusive current measurement methods. Discharge and re-charge events can be determined based on the detected current direction. A given one of the current sensors 112 preferably monitors the current in a single battery string, but more than one string can be monitored with a single current sensor if a field measurement type of probe is employed. The flux-gate magnetic field measurement method is preferred because it is very sensitive to small currents, is non-intrusive and has no direct connection to the monitored battery plant.

Temperature probes 106 are preferably installed in strategic locations at the monitored site. For example, one or more temperature probes 106 can be used to measure the ambient temperature at certain reference locations and the remaining probes 106 can be placed in strategic locations, such as between batteries, on battery straps or posts, or wherever is convenient in a manner that provides a true indication of the temperature of interest. Secure and thermally conductive attachment to the battery terminal post is preferred for best indication of battery internal temperature, but temperature probes 106 can be placed at other locations with attendant accuracy compromises.

Figure 2:
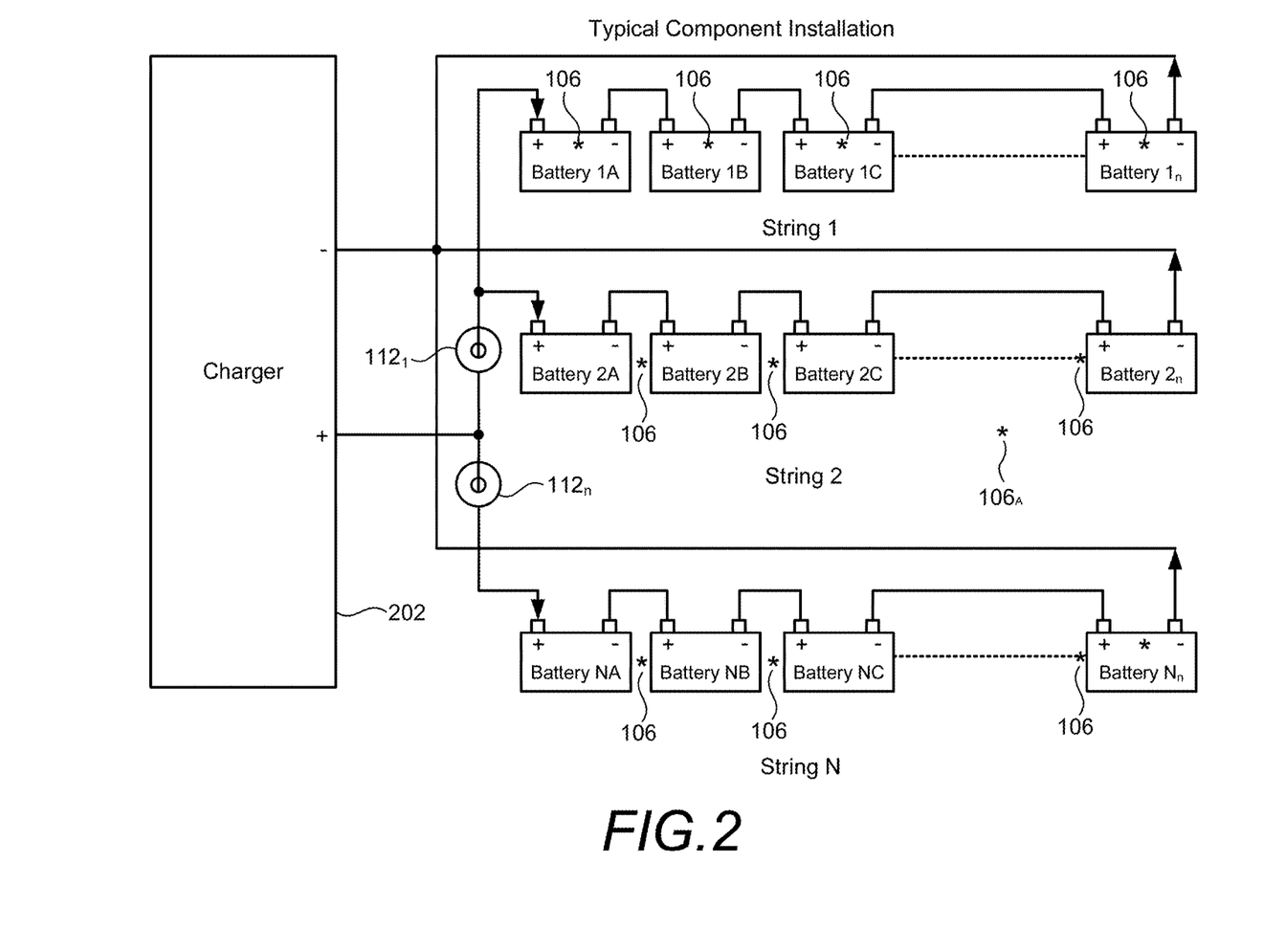
FIG. 2 is a block diagram illustrating certain component installation details of the system of FIG. 1 according to an embodiment of the invention.

As shown in FIG. 2, in an exemplary operation of the present invention, batteries are charged by charger 202 and are operated in series strings in order to obtain a voltage higher than the individual battery cell voltage. There may be multiple strings at a site, and several strings may be charged in parallel from a single charger. In accordance with this exemplary operation, it is preferable to monitor current individually for each battery string and temperature at or near as many batteries as possible, consistent with the maximum number of probes supported by the system.

As shown in FIG. 2, current sensors 112 are each preferably installed in a current-carrying path for a given string, in such a location that they are sensing float charge current. It is possible to monitor more than one string with one sensor 112, but doing so makes it difficult to separate the performance of individual strings. As shown in the example of FIG. 2, current sensor $112_1$ is measuring the combined charge current in String 1 and String 2, and current sensor $112_N$ is monitoring the charge current only in String N.

As also shown in FIG. 2, at least one of the temperature probes $106_A$ is preferably installed in a location that is representative of the ambient temperature of the battery plant, away from drafts and influences such as HVAC air discharges. The remaining temperature probes $106_1$-$106_N$ are preferably placed as close to the monitored battery housing as possible, such as between batteries or affixed to the battery housing, terminal post, or strap, in a thermally conductive manner.

An initial configuration of SCU 102 is preferably performed after all the temperature probes and current sensors have been installed and connected to their respective interface units. Alarm thresholds can be set by the user for each of the monitored measurements. These non-correlated, absolute measurement alarms are called "explicit" alarms. An exemplary process for generating an explicit alarm is shown in the flow chart of FIG. 3. A number of "implicit" alarms may also be generated by correlation of multiple measured conditions. One of these conditions may include checking whether a recent high-current discharge or re-charge event that might have heated the batteries normally has occurred. Thresholds for generation of the implicit alarms may also be set by the user. Guidelines may be provided for determining appropriate alarm thresholds based on, for example, the type, age and size of the monitored battery. Examples of these implicit, algorithmically generated, alarms are shown in the flow charts of FIGS. 4-6.

Figure 3:
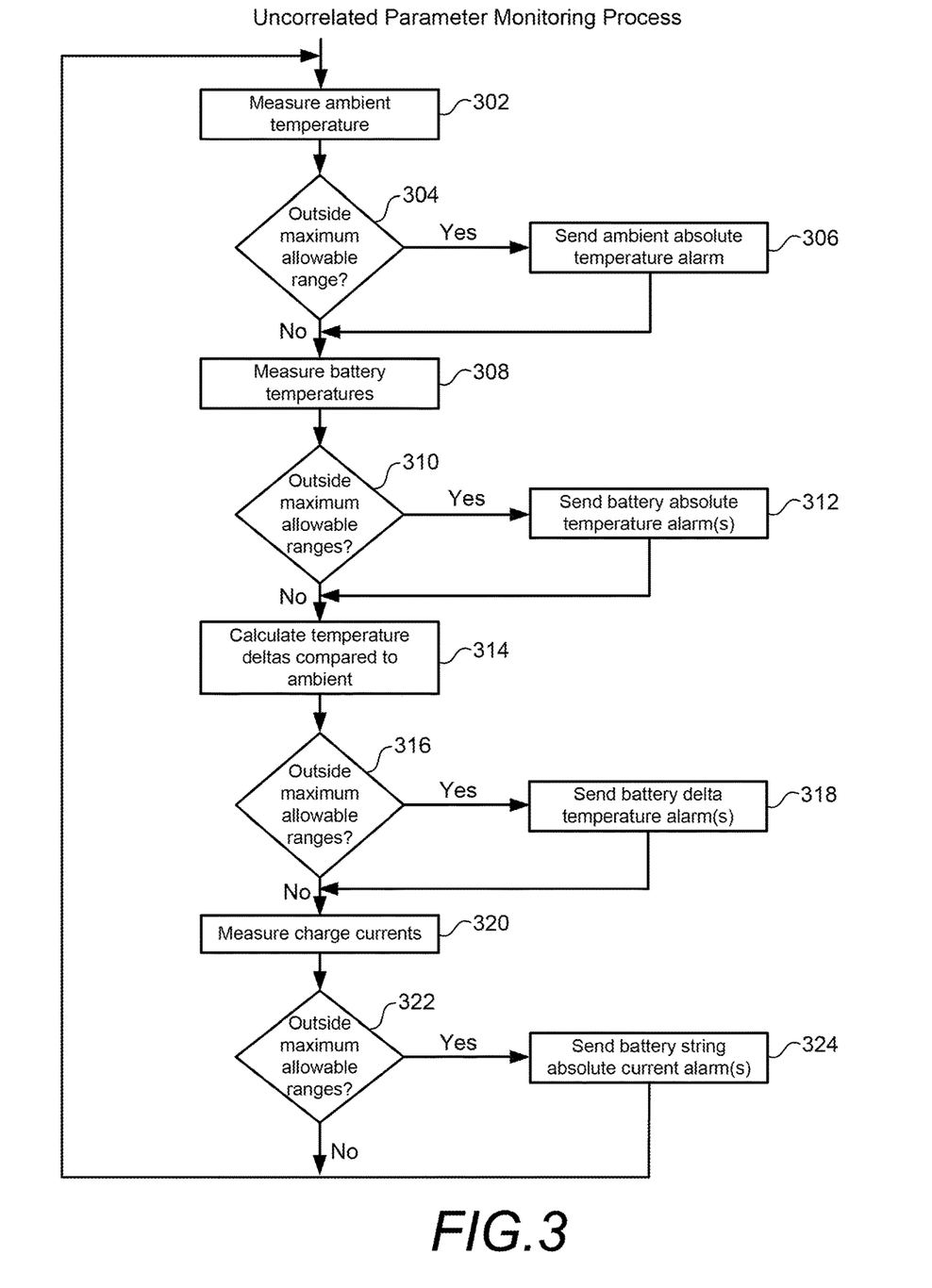
FIG. 3 is a flow chart of a method for monitoring battery characteristics, according to an embodiment of the invention.

FIG. 3 illustrates details of an exemplary uncorrelated parameter monitoring process that may be employed in the practice of the present invention. As shown in the flow chart of FIG. 3, if the absolute ambient temperature (as measured by probe $106_A$), individual probe temperature (as measured by any of probes $106_1$ ... $106_N$), delta temperature (as between the temperatures measured by the ambient probe $106_A$ and any of the individual probes $106_1$ ... $106_N$), or any individual float current measurement (as measured by any of sensors $112_1$ ... $112_N$) exceeds user-defined thresholds, an alarm is generated. The process of FIG. 3 begins as the ambient temperature probe $106_A$ measures the ambient temperature (Step 302). The SCU 102 then determines whether the ambient temperature is outside the maximum allowable range (Step 304). If the ambient temperature is outside the maximum allowable range, the SCU 102 generates an ambient absolute temperature alarm (Step 306). After the ambient absolute temperature alarm has been generated, or if the SCU 102 determines that the ambient temperature is not outside the maximum allowable range, one or more of the individual temperature probes $106_1 \ldots 106_N$ measure their respective battery temperatures (Step 308). The SCU 102 then determines whether any of the battery temperatures is outside a maximum allowable range (Step 310). If any of the battery temperatures are outside the maximum allowable range, the SCU 102 generates one or more battery absolute temperature alarm(s) (Step 312). After the battery absolute temperature alarm(s) have been generated, or if the battery temperatures are not outside the maximum allowable range, the SCU 102 calculates temperature deltas as between the temperature of the batteries and the ambient temperature (Step 314), and determines if the temperature deltas are outside maximum allowable ranges (Step 316). If a temperature delta is outside a maximum allowable range, the SCU 102 generates one or more battery delta temperature alarm(s) (Step 318). At step 320, the current sensors 112 measure the charge currents of their respective string(s) of batteries. The SCU then determines whether the charge currents are outside a maximum allowable range (Step 322). If any charge current is outside the maximum allowable range, the SCU 102 generates one or more battery string absolute current alarm(s) (Step 324).

Figure 4:
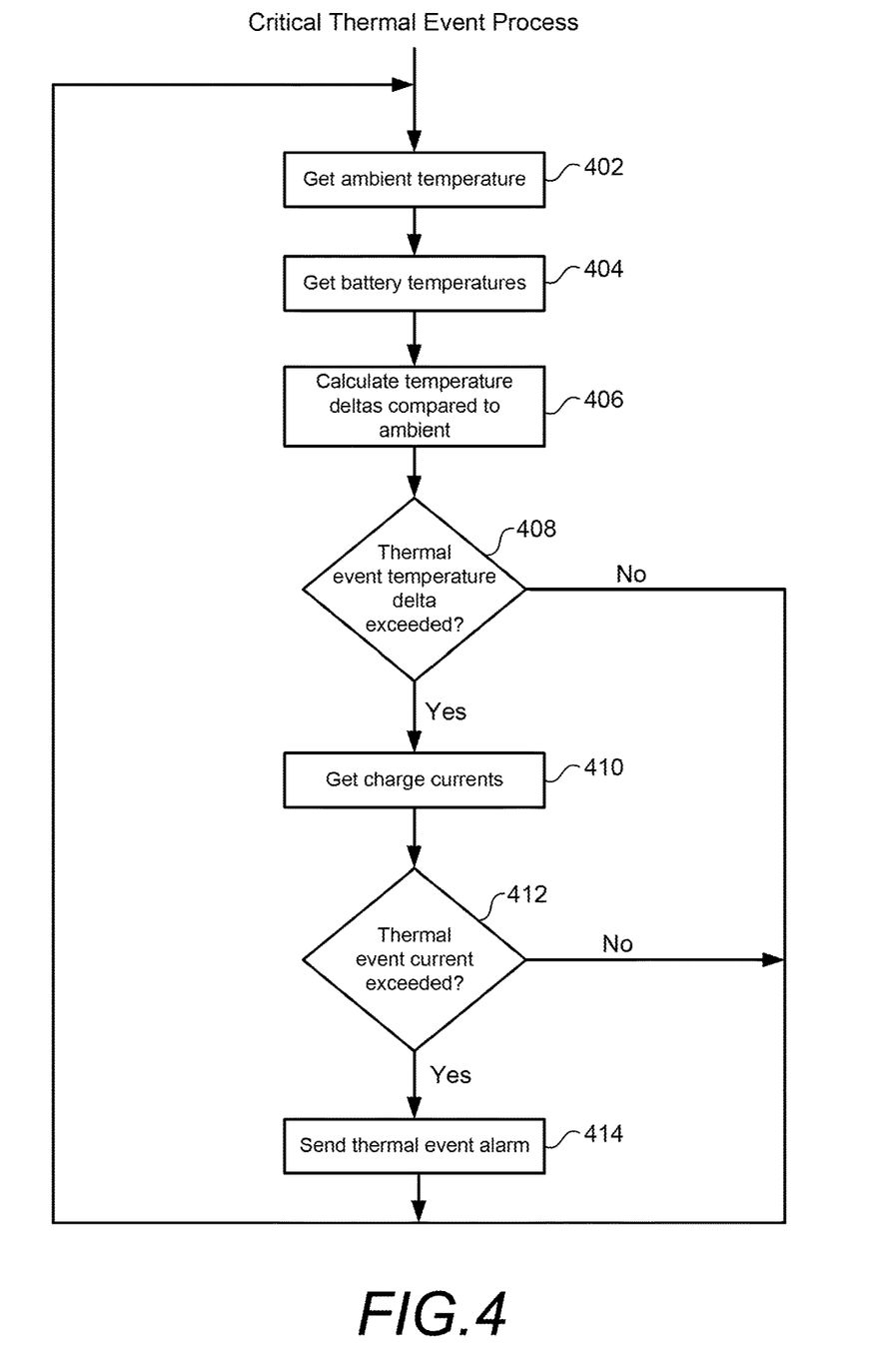
FIG. 4 is a flow chart of a method for determining the existence of a critical thermal event within a battery, according to an embodiment of the invention.

FIG. 4 illustrates details of an exemplary critical thermal event monitoring process that may be employed by the present invention. As shown in the flow chart of FIG. 4, if (i) a temperature delta, and (ii) a respective float charging current, exceed user set thresholds, a critical thermal event alarm is generated, thus indicating a temperature rise caused by excessive charge current. The process of FIG. 4 begins as ambient probe $106_A$ measures the ambient temperature (Step 402) and the individual probes $106_1 \ldots 106_N$ measure their respective battery temperatures (Step 404). Next, the SCU 102 calculates the temperature deltas (Step 406). The SCU 102 then determines whether a given one of the battery temperature deltas exceed a user-defined thermal event temperature delta, which would be indicative of a thermal event (Step 408). If so, the current sensors $112_1$-$112_N$ measure the charge currents of the battery strings (Step 410). The SCU 102 then determines, based on these measurements, whether a user-defined thermal event current has been exceeded (Step 412). If so, the SCU 102 generates a thermal event alarm through the outputs 114 (Step 414).

Figure 5:
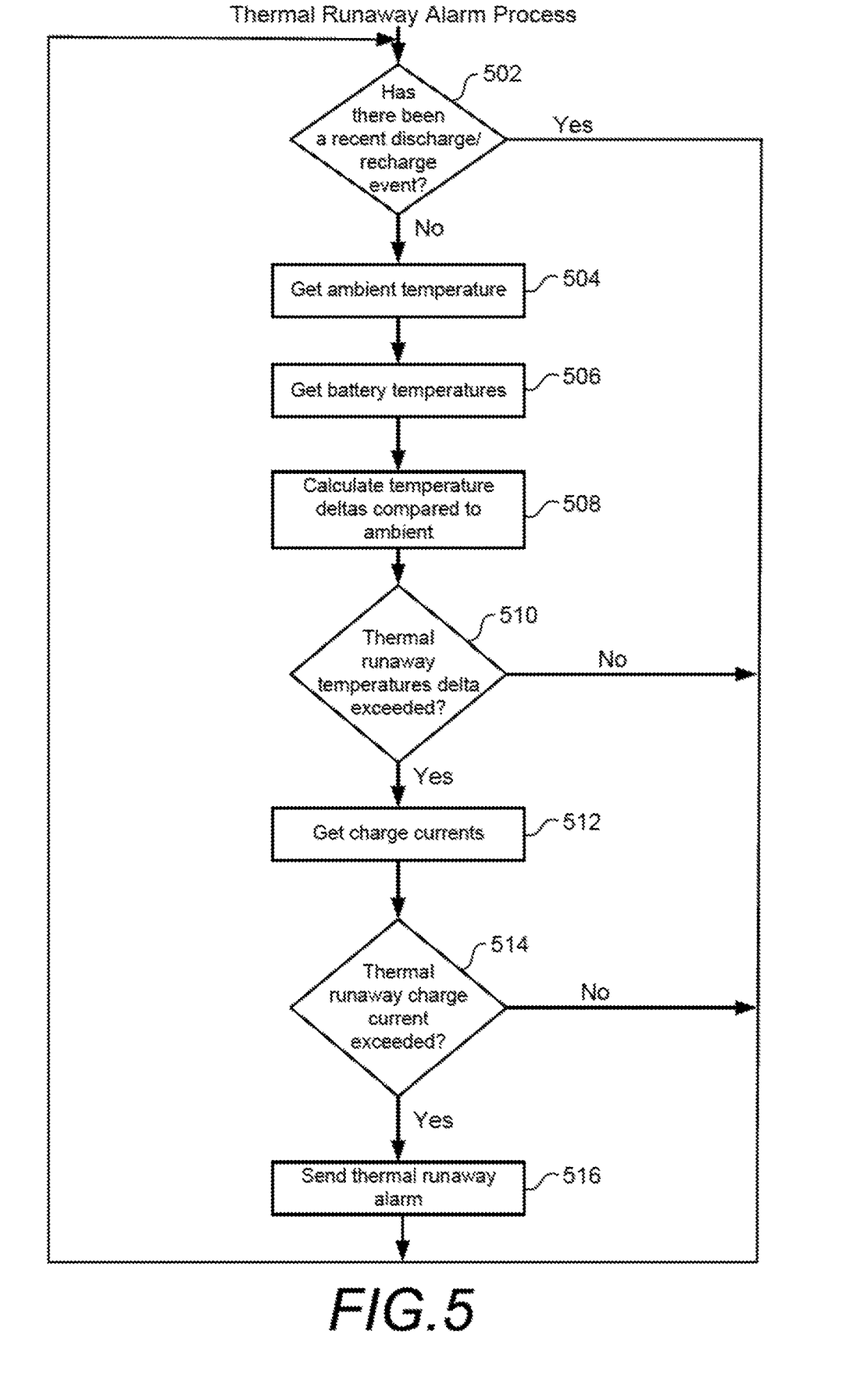
FIG. 5 is a flow chart of a method for determining the existence of a thermal runaway condition within a battery, according to an embodiment of the invention.

FIG. 5 illustrates details of an exemplary thermal runaway monitoring process that may be employed by the present invention. As shown in the flow chart of FIG. 5, if (i) there hasn't been a recent high-current discharge or re-charge event for a user-defined period of time, (ii) a temperature delta exceeds a user threshold, and (iii) a float charging current for a battery string group exceeds a user threshold, then a thermal runaway alarm is generated. The process of FIG. 5 begins as the SCU 102 determines if there has been a recent discharge or recharge event (Step 502). If there has not been a recent discharge or recharge event, ambient and individual battery temperatures are measured, and the SCU 102 calculates the temperature deltas (Step 508). The SCU 102 then determines whether a user set thermal runaway temperature delta has been exceeded, thus indicating a potential thermal runaway condition (Step 510). If a thermal runaway temperature delta has been exceeded, the current sensors 112 measure the charge currents of the one or more battery strings (step 512). The SCU 102 then determines whether a user set thermal runaway charge current has been exceeded (Step 514). If the thermal runaway charge current has been exceeded, the SCU 102 generates a thermal runaway alarm (Step 516).

Figure 6:
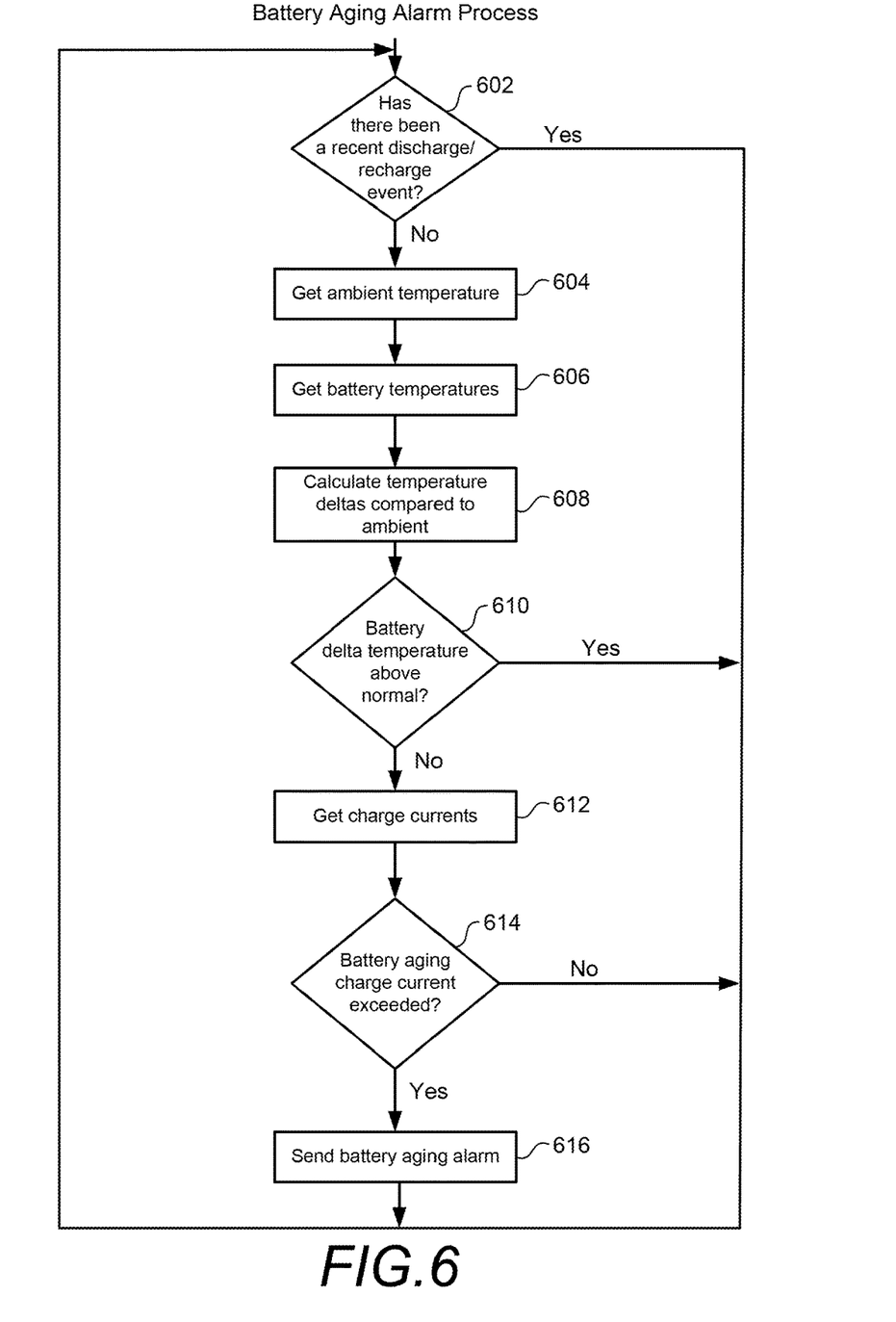
FIG. 6 is a flow chart of a method for determining the existence of a battery aging condition, according to an embodiment of the invention.

FIG. 6 illustrates details of an exemplary battery aging monitoring process that may be employed by the present invention. As shown in the flow chart of FIG. 6, if (i) there hasn't been a recent high-current discharge or re-charge event for a user-defined period of time (as determined, for example, by the process shown in FIG. 5), (ii) a temperature delta is below a user threshold, and (iii) a float charging current for a battery string group exceeds a user threshold, then a battery aging alarm is generated. The process of FIG. 6 begins as the SCU 102 determines if there has been a recent discharge or recharge event (Step 602). If there has not been a recent discharge or recharge event, ambient and individual battery temperatures are measured, and the SCU 102 calculates the temperature deltas (Step 608). The SCU 102 then determines if any of the temperature deltas are below a user set battery aging temperature delta (Step 610). If so, the current sensors 112 measure the charge currents of the one or more battery strings (step 612). The SCU 102 then determines whether a user set battery aging charge current has been exceeded (Step 614). If the user set battery aging charge current has been exceeded, the SCU 102 generates a battery aging alarm (Step 516).

The foregoing system and method presents multiple preferred embodiments of the present invention. It should be appreciated that there are many alternative embodiments within the scope of the present invention. While the invention has been described, disclosed, illustrated, and shown in various terms of certain embodiments or modifications, which it has presumed in practice, the scope of the invention is not intended to be, nor should it be deemed to be, limited thereby and such other modifications or embodiments as may be suggested by the teachings herein are particularly reserved, especially as they fall within the breadth and scope of the claims here appended.

What is claimed:
1. A battery monitoring system comprising:
   a. a plurality of battery temperature probes each adapted to sense the temperature of an associated lead acid battery or lead acid battery string, each battery temperature probe being adapted to be non-intrusively mounted on or adjacent its associated battery or battery string;
   b. an ambient temperature probe adapted to sense the ambient temperature of an environment in which the batteries are located;
   c. a plurality of current sensors each adapted to sense a charge current delivered to an associated battery string during a charging event and a discharge current delivered from an associated battery strings during a discharging event, each current sensor being adapted to non-intrusively measure the charge current and the discharge current; and
   d. a controller configured to:
      i. receive associated data from the battery temperature probes, the ambient temperature probe and the current sensors;
      ii. calculate a plurality of temperature deltas between the ambient temperature and each of the battery or battery string temperatures;
      iii. generate a thermal event alarm if any of the temperature deltas exceed a user-defined thermal event temperature delta and any of the charge currents exceed a user-defined thermal event charge current;

iv. determine if there has been a discharge or recharge event within a period of time;
v. predict:
A. a thermal runaway condition, by correlating charging and discharging currents, discharge/recharge events and temperature deltas and determining that all of the following are satisfied: there has not been a discharge or recharge event for the period of time, any of the temperature deltas exceed a user-defined thermal runaway temperature delta, and any of the charge currents exceed a user-defined thermal runaway charge current; and
B. a battery end of service life condition, by correlating charging and discharging currents, discharge/recharge events and temperature deltas and determining that all of the following are satisfied: there has not been a discharge or recharge event for the period of time, the temperature deltas are below a user-defined battery aging temperature delta, and any of the charge currents exceed a user-defined battery aging charge current; and
vi. generate:
A. a thermal runaway alarm in response to predicting the thermal runaway condition and before the thermal runaway condition has occurred; and
B. a battery end of service life condition alarm in response to predicting the battery end of service life condition.

2. The battery monitoring system of claim 1 wherein the controller is further configured to generate:
a. an ambient absolute temperature alarm if the ambient temperature is outside of a user-defined ambient absolute temperature range;
b. a battery absolute temperature alarm if one or more of the battery or battery string temperatures is outside of a user-defined battery absolute temperature range;
c. a battery delta temperature alarm if one or more of the temperature deltas exceeds a user-defined delta temperature threshold; and
d. a battery string absolute current alarm if one or more of the charge currents is outside of a user-defined battery string charge current range.

3. The battery monitoring system of claim 1 further comprising (i) one or more remote input modules each adapted for connection to the controller and the battery temperature probes, and (ii) one or more current monitoring interfaces each adapted for connection to the controller and the current sensors.

4. The battery monitoring system of claim 1 wherein the charge current is a float charge current.

5. The battery monitoring system of claim 1 wherein the current sensors comprise flux-gate sensors.

6. The battery monitoring system of claim 1 further comprising a plurality of battery sensors each adapted for connection to a terminal post of an associated battery.

7. The battery monitoring system of claim 6 wherein the controller is adapted to receive data from each of the battery sensors and determine, from the data, a health condition of each associated battery.

8. The battery monitoring system of claim 1 wherein the controller further comprises contact closure outputs adapted for connection to an alarm monitoring system.

9. A battery monitoring method comprising:
a) non-intrusively measuring the temperature of each of a plurality of lead acid batteries or lead acid battery strings;
b) measuring the ambient temperature of an environment in which the batteries are located;
c) non-intrusively measuring a charge current being delivered to each of the battery strings during a charging event and a discharge current being delivered from each of the battery strings during a discharging event;
d) calculating a plurality of temperature deltas between the ambient temperature and each of the battery or battery string temperatures;
e) generating a thermal event alarm if any of the temperature deltas exceed a user-defined thermal event temperature delta and any of the charge currents exceed a user-defined thermal event charge current;
f) determining if there has been a discharge or recharge event within a period of time;
g) predicting:
i. a thermal runaway condition, by correlating charging and discharging currents, discharge/recharge events and temperature deltas and determining that all of the following are satisfied: there has not been a discharge or recharge event for the period of time, any of the temperature deltas exceed a user-defined thermal runaway temperature delta, and any of the charge currents exceed a user-defined thermal runaway charge current; and
ii. a battery end of service life condition, by correlating charging and discharging currents, discharge/recharge events and temperature deltas and determining that all of the following are satisfied: there has not been a discharge or recharge event for the period of time, the temperature deltas are below a user-defined battery aging temperature delta, and any of the charge currents exceed a user-defined battery aging charge current;
h. generating:
A. a thermal runaway alarm in response to predicting the thermal runaway condition and before the thermal runaway condition has occurred; and
B. a battery end of service life condition alarm in response to predicting the battery end of service life condition.

10. The method of claim 9 further comprising generating:
a. an ambient absolute temperature alarm if the ambient temperature is outside of a user-defined ambient absolute temperature range;
b. a battery absolute temperature alarm if one or more of the battery or battery string temperatures is outside of a user-defined battery absolute temperature range;
c. a battery delta temperature alarm if one or more of the temperature deltas exceeds a user-defined delta temperature threshold; and
d. a battery string absolute current alarm if one or more of the charge currents is outside of a user-defined battery string charge current range.

11. The method of claim 9 wherein the charge current is a float charge current.

12. The method of claim 9 wherein the charge current is measured using flux-gate sensors.

13. The method of claim 9 further comprising receiving data relating to a health condition of the batteries, and, based on the received data, determining a health condition of the batteries.

14. A battery monitoring system comprising:
a. a plurality of battery temperature probes, each non-intrusively mounted on or adjacent an associated lead acid battery or lead acid battery string for sensing the temperature of its associated battery or battery string;

b. an ambient temperature probe mounted in a reference location of an environment in which the batteries are located for sensing the ambient temperature of the environment;

c. a plurality of current sensors, each non-intrusively mounted on or adjacent an associated battery string for sensing a charge current delivered to the associated battery string during a charging event and a discharge current delivered from the associated battery string during a discharging event; and d. a controller configured to:
  i. receive associated data from the battery temperature probes, the ambient temperature probe and the current sensors;
  ii. calculate a plurality of temperature deltas between the ambient temperature and each of the battery or battery string temperatures;
  iii. generate a thermal event alarm if any of the temperature deltas exceed a user-defined thermal event temperature delta and any of the charge currents exceed a user-defined thermal event charge current;
  iv. determine if there has been a discharge or recharge event within a period of time; and
  v. predict:
    A. a thermal runaway condition, by correlating charging and discharging currents, discharge/recharge events and temperature deltas and determining that all of the following are satisfied: there has not been a discharge or recharge event for the period of time, any of the temperature deltas exceed a user-defined thermal runaway temperature delta, and any of the charge currents exceed a user-defined thermal runaway charge current; and
    B. a battery end of service life condition, by correlating charging and discharging currents, discharge/recharge events and temperature deltas and determining that all of the following are satisfied: there has not been a discharge or recharge event for the period of time, the temperature deltas are below a user-defined battery aging temperature delta, and any of the charge currents exceed a user-defined battery aging charge current;
  vi. generate:
    A. a thermal runaway alarm in response to predicting the thermal runaway condition and before the thermal runaway condition has occurred; and
    B. a battery end of service life condition alarm in response to predicting the battery end of service life condition.

15. The battery monitoring system of claim 14 wherein the controller is further configured to generate:
  a. an ambient absolute temperature alarm if the ambient temperature is outside of a user-defined ambient absolute temperature range;
  b. a battery absolute temperature alarm if one or more of the battery or battery string temperatures is outside of a user-defined battery absolute temperature range;
  c. a battery delta temperature alarm if one or more of the temperature deltas exceeds a user-defined delta temperature threshold; and
  d. a battery string absolute current alarm if one or more of the charge currents is outside of a user-defined battery string charge current range.

16. The battery monitoring system of claim 14 further comprising (i) one or more remote input modules each connected to the controller and a plurality of the battery temperature probes and ambient temperature probes, and (ii) one or more current monitoring interfaces each connected to the controller and one of the current sensors.

17. The battery monitoring system of claim 14 wherein the charge current is a float charge current.

18. The battery monitoring system of claim 14 wherein the current sensors comprise flux-gate sensors.

19. The battery monitoring system of claim 14 wherein at least one of the current sensors non-intrusively measures the charge current and the discharge current of two or more battery strings.

20. The battery monitoring system of claim 14 further comprising a plurality of battery sensors each connected to a terminal post of an associated battery.

21. The battery monitoring system of claim 20 wherein the controller receives data from each of the battery sensors and determines, from the data, a health condition of each associated battery.

22. The battery monitoring system of claim 14 wherein the controller further comprises contact closure outputs connected to an alarm monitoring system.

* * * * *